United States Patent Office 3,748,109
Patented July 24, 1973

3,748,109

CONDUCTIVE DESIGNS AND PROCESS FOR THEIR MANUFACTURE

Sung Ki Lee, Niagara Falls, N.Y., assignor to Hooker Chemical Corporation, Niagara Falls, N.Y.

No Drawing. Continuation-in-part of application Ser. No. 727,045, May 6, 1968, now Patent No. 3,625,730. This application June 11, 1971, Ser. No. 152,395
The portion of the term of the patent subsequent to Dec. 7, 1988, has been disclaimed
Int. Cl. C23b *5/48, 5/60;* B23p *3/00*
U.S. Cl. 29—195 22 Claims

ABSTRACT OF THE DISCLOSURE

Printed circuits, integrated circuits, resistors, thermocouples, condensers, superconductors, electroformed materials, and the like are produced by providing a plastic or substantially non-metallic substrate with a metal phosphorus compound; applying a resist; removing the unprotected metal phosphorus compound; dissolving the resist; and subjecting the substrate to electroless or electrolytic treatment.

This application is a continuation-in-part of copending application Ser. No. 727,045, filed May 6, 1968 now Pat. No. 3,625,730.

BACKGROUND OF THE INVENTION

The use of printed apparatus or articles, such as circuits, resistors, condensers and the like in the electronic industry has become widespread in recent years. One of the major problems encountered in producing such electronic apparatus has been the lack of an inexpensive, precision metallizing process. It has also been difficult to provide firm adhesion between the metallic conductor and the substrate. Previous methods of producing designs on plastic or non-metallic substrates have required selective etching of a metal layer or a series of selective etchings, or involved many process steps. The term "design" as used herein, means predetermined areas of conductivity. Said designs may take the form of printed circuits, integrated circuits, resistors, special resistors, inductors, thermocouples, capacitors, semi- and super-conductors, condensers, special condensers, electron tubes, solid state apparatus, electroformed materials, and the like.

New processes for metallizing substrates are described in copending application Ser. No. 23,967, filed Mar. 30, 1970 now Pat. No. 3,650,708, and copending application Ser. No. 750,488, filed Aug. 6, 1968 and now abandoned. The present invention relates to the production of designs on plastic or substantially non-metallic substrates with said metallizing processes.

Accordingly, it is an object of this invention to provide a process for the production of designs on plastic or substantially non-metallic substrates with the metallizing systems of Ser. No. 750,488 and Ser. No. 23,967.

Another object of the invention is to provide a process whereby said design will be adherently bound to said plastic or substantially non-metallic substrate.

A further object is to provide a process capable of producing a vast number of design configurations, such as printed circuits, resistors, thermocouples, and the like.

Still further objectives will become apparent to those skilled in the art from the following disclosure.

SUMMARY OF THE INVENTION

This invention relates to designs on plastic or substantially non-metallic substrates and a novel process for their formation. More particularly, this invention relates to designs on plastic or substantially non-metallic substrates in the form of printed circuits, integrated circuits, resistors, special resistors, inductors, thermocouples, capacitors semi- and super-conductors, condensers, special condensers, electron tubes, solid state apparatus, electroformed materials, and the like, produced by a process which comprises providing said substrate with a metal phosphorus compound; applying a resist; removing said metal phosphorus compound from the unprotected areas; dissolving the resist, and subjecting the thus-treated substrate to electroless and/or electrolytic treatment.

DESCRIPTION OF THE PREFERRED EMBODIMENT

The first treatment step of the preferred process of this invention comprises providing a plastic or substantially non-conductive substrate with a metal phosphorus compound by the process of Ser. No. 750,488 and Ser. No. 23,967. The term metal-phosphorus compound, as used herein, means that compound or complex formed at the surface of the substrate by treatment of the phosphorus compounds disclosed in Ser. No. 23,967 and Ser. No. 750,488 with metal salts and complexes thereof disclosed therein. Briefly, the process of Ser. No. 750,488 comprises treating the substrate with at least one low oxidation state phosphorus compound. The low oxidation state phosphorus compound, wherein the phosphorus has an oxidation state of less than 5, i.e., an oxidation number of $-3$ to $+3$, can be prepared by reacting elemental phosphorus, preferably elemental white phosphorus (which includes various impure or commercial grades sometimes referred to as yellow phosphorus), with a suitable nucleophilic reagent or organometallic compound (including Grignard reagents). The process of Ser. No. 23,967 comprises depositing phosphorus sesquisulfide at the surface of the substrate and thereafter treating with a metal salt or complex thereof to form a metal-phosphorus-sulfur compound thereon.

Suitable solvents or diluents for the phosphorus compounds are solvents that dissolve the compounds and which preferably swell the surface of a plastic without detrimentally affecting the surface of the plastic. Such solvents include the halogenated hydrocarbons and halocarbons such as chloroform, methyl chloroform, trichloroethylene, perchloroethylene, ethyl dibromide and the like; aromatic hydrocarbons such as benzene, toluene, xylene and the like.

When a solution of a phosphorus compound is employed, the concentration is generally in the range from about 0.0001 weight percent of phosphorus based on the weight of the solution up to a saturated solution, and preferably from about 1.5 to about 2.5 percent. The phosphorus compound treatment is generally conducted at a temperature below the softening point or decomposition point of the substrate, and below the boiling point of the solvent, if a solvent is used. Generally, the temperature is in the range of about 30 to about 135 degrees centigrade, but preferably in the range of about 50 to about 100 degrees centigrade. The contact time varies depending on the nature of the substrate, the solvent and temperature, but is generally in the range of about one second to one hour or more, preferably of about one to ten minutes.

The processes of Ser. No. 23,967 and Ser. No. 750,488 are applicable to substrates, such as plastics and to other substantially non-metallic substrates. Suitable substrates include, but are not limited to, cellulosic and ceramic materials such as cloth, paper, wood, cork, cardboard, clay, porcelain, leather, porous glass, asbestos cement, and the like. Semi-conductive substrates such as polycrystalline silicon carbides and its derivatives, polycrystalline boron carbides and its derivatives, polycrystalline aluminum oxide and its derivatives, polycrystalline germanium and gallium and their derivatives, and the like can also be employed.

Typical plastics to which the process of this invention is applicable include the homopolymers and copolymers of ethylenically unsaturated aliphatic, alicyclic and aromatic hydrocarbons such as polyethylene, polypropylene, polybutene, ethylenepropylene copolymers; copolymers of ethylene or propylene or with other olefins, polybutadiene; polymers of butadiene, polyisoprene, both natural and synthetic, polystyrene including high impact polystyrene, and polymers of pentene, hexene, heptene, octene, 2-methylpropene, 4-methyl-hexene-1, bicyclo (2.2.1)-2-heptene, pentadiene, hexadiene, 2,3-dimethylbutadiene-1,3,4-vinylcyclohexene, cyclopentadiene, methylstyrene, and the like. Other polymers useful in the invention include polyhalogenated hydrocarbon polymers including fluoro polymers such as polytetrafluoroethylene; polysilicone and polyhalogenated silicones; polyindene, indenecoumarone resins; polymers or acrylate esters and polymers of methacrylate esters, acrylate and methacrylate resins such as ethyl acrylate, n-butyl methacrylate, isobutyl methacrylate, ethyl methacrylate and methyl methacrylate; alkyl resins; cellulose derivatives such as cellulose acetate, cellulose acetate butyrate, cellulose nitrate, ethyl cellulose, hydroxyethyl cellulose, methyl cellulose and sodium carboxymethyl cellulose; epoxy resins, furan resins (furfuryl alcohol or furfuralketone); hydrocarbon resins from petroleum; isobutylene resins (polyisobutylene); isocyanate resins (polyurethanes); melamine resins such as melamine formaldehyde and melamine-urea-formaldehyde; oleo resins; phenolic resins such as phenol-formaldehyde, phenolic-elastomer, phenolic epoxy, phenolic-polyamide, and phenolic-vinyl acetals; polyamide polymers such as polyamides, polyamide-epoxy and particularly long chain synthetic polymeric amides containing recurring carbonamide groups as an integral part of the main polymer's chain; polyacrylamides; polysulfones; polyester resins such as unsaturated polyesters of dibasic acids and dihydroxy compounds, and polyester elastomers and resorcinol resins such as resorcinol-formaldehyde, resorcinol-furfural, resorcinol-phenol-formaldehyde, resorcinol-polyamide and resorcinol-urea; rubbers such as natural rubber, synthetic polyisoprene, reclaimed rubber, chlorinated rubber, polybutadiene, cyclized rubber, butadiene-acrylonitrile rubber, butadiene-styrene rubber, and butyl rubber, neoprene rubber (polychloroprene); polysulfides (Thiokol); terpene resins, urea resins; vinyl resins such as polymers of vinyl acetal, vinyl acetate or vinyl alcohol-acetate copolymers, vinyl alcohol, vinyl chloride, vinyl butyral, vinyl chloride-acetate copolymer, vinyl pyrrolidone and vinylidene chloride copolymer; polyformaldehyde; polyethers, such as polyphenylene oxide, polymers of diallyl phthalates and phthalates; polycarbonates of phosgene or thiophosgene and dihydroxy compounds such as bisphenols, thermoplastic polymers of bisphenols and epichlorohydrin (trade name Phenoxy polymers); graft copolymers and polymers of unsaturated hydrocarbons and an unsaturated monomer such as graft copolymers of polybutadiene, styrene and acrylonitrile, commonly called ABS resins, ABS-polyvinyl chloride polymers; acrylic polyvinyl chloride polymers; and any other suitable natural and synthetic polymers.

The polymers can be used in the unfilled conditions, or with fillers such as glass fiber, glass powder, glass beads, asbestos, talc or other mineral fillers, wood flour and other vegetable fillers, carbon in its various forms, dyes, pigments, waxes and the like.

The substrates can be in various physical forms, such as shaped articles, for example, moldings, sheets, rods, and the like; fibers, films and fabrics, and the like and of various thicknesses.

Following the phosphorus compound treatment, the substrate can be subjected to water and/or aqueous solution of a surfactant, as disclosed in my copending application Ser. No. 671,331, filed Sept. 28, 1967, and then dried by exposure to the atmosphere, inert atmospheres such as nitrogen or carbon dioxide, radiant heaters, or placed in a conventional oven. The rinsing and drying steps are optional.

The phosphorus compound treated substrate is then contacted with a bath containing a solution of a metal salt or complex of a metal salt which is capable of reacting with the phosphorus compound to form a metal phosphorus compound. The metals generally employed are those of Groups I–B, II–B, IV–B, V–B, VI–B, VII–B, and VIII of the Periodic Table. The preferred metals are copper, silver, gold, chromium, manganese, cobalt, nickel, palladium, titanium, zirconium, vanadium, tantalum, cadmium, tungsten, molybdenum, and the like. The bath can also contain a small amount of $OH^-$, $AlR_3H$—, $BR_3H^-$, or mixtures thereof, wherein each R is individually selected from the group consisting of alkyl, aryl and hydrogen for low temperature operation as disclosed in my copending application, Ser. No. 694,122, filed Dec. 28, 1967.

The metal salts can contain a wide variety of anions. Suitable anions include sulfate, chlorate, nitrate, cyanide, chloride, and the like; formate, acetate, caprylate, palmitate and the like.

The metal salts can be complexed with a complexing agent that produces a solution having a basic pH (>7). Particularly useful are the ammoniacal complexes of the metal salts, in which one to six ammonia molecules are complexed with the foregoing metal salts. Other useful complexing agents include quinolines, amines and pyridines.

The foregoing metal salts and their complexes are used in ionic media, preferably in aqueous solutions. However, non-aqueous media can be employed. The solution concentration is generally in the range from about 0.1 weight percent metal salt or complex based on total weight of the solution up to a saturated solution.

The treated substrates can be subjected directly to the second treatment step of this invention or can be stored for later use.

The second treatment step of the preferred process comprises applying a resist on the areas of the substrate which are to be conductive in the printed apparatus. The resist is selected so that it will be impervious to the washing agent of the third treatment step described hereinbelow, and/or the electroless and/or electrolysis solutions if one of the alternative embodiments, described hereinafter, is employed. Any of the previously known resists can be employed and any method of application can be used. For example, resists including oil, cellulose, vinyl or natural resin based, and the like, can be applied by screening methods; resists such as fish glue, gum arabic, gelatic, albumen, shellac sensitized with ammonium dichromate, and the like can be applied by photo methods; inks reinforced with a bituminous powder or dragon's blood, and the like, can be applied by offset printing; and the like.

The third treatment step of the preferred process comprises subjecting the printed substrate to a washing agent to remove the metal phosphorus compound from the unprotected portion of the substrate. Said washing agent comprises any oxidizing media (either acidic or basic). Representative agents include the hypophosphates, ceric perchlorate, ceric nitrate, ceric sulfate, potassium permanganate, potassium dichromate, potassium bromate, potassium iodate, iodine-potassium iodide, potassium ferricyanide, ferric chloride, cupric chloride, ammonium persulfate, and the like; oxidizing mineral acids such as nitric, hydrochloric, hypochloric, phosphoric, periodic, sulfuric, chromic, and the like; peracids, peroxides, organic and inorganic ozonites such as $KO_3$, and the like. The preferred agents are nitric acid, in the form of an about 50 percent by volume water solution; 10 percent hypochloride acid by volume water solution; and 30 percent $H_2O_2$ by volume water solution. The removal of the metal phosphorus compound can be accelerated by the addition of a metal which will go into solution with the washing agent. For example, copper sulfate can be employed with the 50% nitric acid, copper sulfate or cobalt chlorides can be employed with the 10% hypochloride acid. When the metal phosphorus compound is a copper phosphorus compound, it is preferred to employ dilute nitric acid (20–30% by volume) at room temperature. Hot, concentrated nitric acid is avoided because while it will remove the metal phosphorus compound effectively, it also dissolves copper. The dilute nitric acid generally requires 7 to 15 minutes to remove the copper phosphorus compound. This time can be reduced to 30 seconds when the acid is first allowed to react with copper. As a result of the third treatment step, the substrate contains a resist-covered metal phosphorus compound over the areas which will be conductive in the final product.

The fourth treatment step of this process comprises dissolving the resist. The dissolving agent is selected so that it will not react with the remaining metal phosphorus compound. Among the various agents which can be used for this purpose are the halogenated hydrocarbons and halocarbons such as chloroform, methyl chloroform, phenyl chloroform, dichloroethylene, trichloroethylene, perchloroethylene, trichloroethane, dichloropropane, ethyl dibromide, ethyl chlorobromide, propylene dibromide, monochlorobenzene, monochlorotoluene and the like; aromatic hydrocarbons such as benzene, toluene, xylene, ethyl benzene, naphthalene and the like. The preferred dissolving agent is trichloroethylene. The thus-treated substrate contains a metal phonphorus compound over the areas which are to be conductive.

Before depositing metal on the designed substrate, it is often advantageous to remove the residual dissolving agent. This can be accomplished by washing the substrate with aqueous or 100% dimethyl formamide; alcohol such as isopropyl and butyl; alcohol-dimethyl formamide mixtures; hot water; detergent-water mixtures; and the like.

The designed substrate can be stored for later use or subjected to a process that has become known in the art as electroless plating or chemical plating. In a typical electroless plating process, a plastic surface is contacted with a solution of a metal salt under conditions in which the metallic ion of the metal salt is reduced to the metallic state and deposited on the surface. The use of the electroless process with the products of this invention relies on the metal phosphorus compound to activate the reduction process.

The designed substrate can also be electroplated by processes known in the art. The treated article is generally used as the cathode. The metal desired to be plated is generally dissolved in an aqueous plating bath, although other media can be employed. Generally, a soluble metal anode of the metal to be plated can be employed. In some instances, however, a carbon anode or other inert anode is used. Suitable metals, solutions and conditions for electroplating are described in Metal Finishing Guidebook Directory for 1967, published by Metals and Plastics Publications, Inc., Westwood, N.J.

All surfaces of the substrate can be treated at the same time by the process of this invention. It is also possible to produce what is known in the art as through connections or through-hole connections. This is accomplished by drilling or punching holes in the substrate corresponding to the desired through connections. However, it is not necessary to obtain a smooth surface on the hole walls. Thereafter, the substrate is treated by the preferred process of this invention, resulting in a metal phosphorus compound design on the surfaces and a metal phosphorus compound on the hole walls. Subsequent electroless or electrolytic treatment will deposit metal on all portions of the metal phosphorus compound.

The preferred process can be modified to include a negative resist treatment. Herein the resist is applied in a negative or reverse pattern, i.e., over the areas which are not to be conductive, followed by the electrodeposition or electroless deposition of metal on the exposed metal phosphorus compound. The resist is removed and then the resulting exposed metal phosphorus compound is removed.

A further modification of the invention comprises applying a resist in a negative pattern, providing the substrate with a metal phosphorus compound as described in the first treatment step of the preferred process, and thereafter either removing the resist and subjecting the substrate to electroless and/or elecrolytic plating or subjecting the substrate to electroless and/or electrolytic plating and thereafter removing the resist.

The following examples serve to illustrate the invention but are not intended to limit it. Unless specified otherwise, all temperatures are in degrees centigrade and all parts are understood to be expressed in parts by weight.

Example 1

A polypropylene sheet was immersed in a 2% solution of phosphorus in trichloroethylene at 60° C. for 3 minutes and then washed with a 60% solution of DMF in water at 50° C. for 30 seconds. The sheet was then placed in a two-liter nickel bath which contained 1950 cc. of 2% $NiCl_2$ in 23% $NH_4OH$ and 50 cc. of 20% NaOH. After 10 minutes the sheet was withdrawn and was found to have obtained a highly conductive black nickel phosphide coating. The immersion in the nickel bath was done at room temperature.

Example 2

An ABS plastic sample was treated as in Example 1 except that a 1% solution of phosphorus in a mixture of trichloroethylene and perchloroethylene was employed and the time of immersion in the phosphorus solution was 2 minutes. An excellent quality black coating was produced on the sample.

Example 3

Specimens of polyethylene, polystyrene, polyvinylchloride and polymethylmethacrylate were treated with phosphorus vapor by suspending the plastic specimen for 1 hour in an atmosphere of phosphorus vapor maintained at 100° C. Subsequently, the phosphorus-treated plastic specimens were immersed for 10 minutes in a solution prepared by adding sufficient ammonium hydroxide to a silver nitrate solution to form the complex $$AgNO_3 \cdot 6NH_3$$

The treatment resulted in the formation of a silver phosphide deposit at the plastic surface.

Example 4

Samples of cardboard, cork, porous clay, and asbestos cement were subjected to a 2% solution of phosphorus in trichloroethylene at 60° C. and then to a 10% solution of nickel sulfate in excess ammonium hydroxide at 90° C., to form a nickel phosphide at the surface of the substrates.

Example 5

A specimen of polyethylene was immersed in a solution of yellow phosphorus dissolved in trichloroethylene for 1 minute. The resulting phosphorus-treated polyethylene specimen was thereafter immersed in an aqueous solution of copper sulfate for several minutes. The treated polyethylene specimen was washed with water, wiped dry and then dried with hot air. The resulting film of copper phosphide was found to be conductive.

Example 6

A polypropylene substrate provided with a copper phosphide as in Example 5 was printed with a photo resist (KPR manufactured by Kodak) in a design (pattern) corresponding to a printed circuit. The substrate was then subjected for 5 minutes to 50% by volume nitric acid and water maintained at 30° C. to dissolve the unprotected copper phosphide. The thus-treated substrate was immersed in trichloroethylene at 78° C. for 10 minutes to dissolve the resist. The resulting substrate had an adherent printed circuit configuration of copper phosphide on its surface. Thereafter, wires were adherently bound to the copper phosphide by soldering.

Example 7

Specimens of polyvinylchloride-polypropylene copolymer were washed with trichloroethylene for 2 minutes at 65° C. and air-dried at room temperature for 1 minute. The samples were then immersed in a bath containing a 2% solution of phosphorus in trichloroethylene and an equal volume of water. The specimens remained 8 minutes in the phosphorus-trichloroethylene layer at 55° C. and 3 minutes in the water layer at 65° C. before being subjected to DMF maintained at room temperature for 6 minutes. The thus-treated specimens were immersed for 20 minutes in an ammonical solution of nickel sulfate maintained at 65° C. The resulting specimens had a high-gloss black nickel phosphide conductive coating on their surface and a design was printed on their surface with a photo resist. The specimens were subjected to a 50% by volume nitric acid and water solution maintained at 30° C. for 5 minutes. Thereafter, the treated specimens were immersed in trichloroethylene at 78° C. for 10 minutes. The resulting specimens had an adherent nickel phosphide design on their surface.

Example 8

A sample of polypropylene was treated as described in Example 7 to form a nickel phosphide pattern which can be characterized as having fine grooves, i.e., fine, sharply defined areas which were not conductive between the nickel phosphide areas of the sample. The sample was thereafter subjected to an electroless nickel plating bath and chromate passivation. The sample was then electroplated with ductile nickel to a thickness of 4 mils. The ductile nickel layer was separated from the original printed design to produce a replica of the pattern on the electroformed material.

Example 9

Strips of polypropylene were treated for 2 minutes at 73° C. with perchloroethylene, air dried for 20 seconds and thereafter treated for 6 minutes at 43° C. in a 1% solution of phosphorus sesquiphosphide in perchloroethylene. The phosphorus sesquiphosphide treated substrate was thereafter air-dried for 3 minutes and then transferred to an ammonical copper chloride solution at 66° C., for 10 minutes. The ammonical copper chloride solution containing 6 grams $CuCl_2$, 5 cc. ethylene diamine, enough $NH_4OH$ to dissolve the initial precipitant prior to the addition of the ethylene diamine, and water to make a total volume of 60 cc. The polypropylene acquired an adherent, conductive copper-phosphorus-sulfur compound on its surface.

Example 10

A polypropylene substrate is provided with a copper phosphorus-sulfur compound by the method of Example 9 and is thereafter printed with a photo resist (KPR manufactured by Kodak) in a design (pattern) corresponding to a printed circuit. The substrate is thereafter subjected for 5 minutes to a 50% by volume nitric acid and water maintained at 30° C., so as to dissolve the unprotected copper-phosphorus-sulfur compound. The thus-treated substrate is thereafter immersed in trichloroethylene at 78° C., for 10 minutes to dissolve the resist.

Example 11

A half mole of $NaOC_2H_5$ was prepared by adding 11.5 grams of sodium to 300 ml. of ethanol. A low oxidation state phosphorus compound was prepared by stirring at room temperature for several hours a mixture of 0.5 mole of white phosphorus with the $NaOC_2H_5$ solution. Samples of polyurethane, a graft copolymer of polybutadiene, styrene and acrylonitrile (ABS), and polyvinylchloride were immersed in this solution for about 3 minutes at room temperature, exposed to air for 5 minutes, washed with water and immersed in an electroless bath prepared from 40 ml. of water, 10 ml. of 28 percent $NH_4OH$, 1.8 grams of $NiCl_2 \cdot 6H_2O$ and 1 gram of $NaH_2PO_2$. After 2 minutes in the bath, the plastics had obtained adherent, conductive coatings.

Example 12

The sample treated in accordance with Example 11 are thereafter treated by the method of Example 10. The resulting substrate has an adherent printed circuit configuration of copper phosphorus compound on its surface. Thereafter, wires are adherently bound to the copper phosphide by soldering.

Example 13

Samples of polyurethane, a graft copolymer of polybutadiene, styrene and acrylonitrile (ABS) and polyvinylchloride are treated in accordance with Example 11. The thus treated samples are thereafter printed with a photo resist (KPR manufactured by Kodak) in a design (pattern). The thus-treated samples are thereafter subjected to an electroless nickel plating bath and chromate passivation so as to deposit metal on the exposed metal phosphorus compound. The thus treated substrate is thereafter immersed in trichloroethylene at 78° C. for 10 minutes to dissolve the resist.

Various changes and modifications other than those described hereinabove can be made in the process and products of this invention without departing from the spirit and scope of the invention. The various embodiments of the invention disclosed herein serve to further illustrate the invention but are not intended to limit it.

What is claimed is:

1. A process for forming a design on a non-metallic substrate which comprises contacting a substrate with a low oxidation state phosphorus compound having an oxidation number of −3 to +3, and thereafter subjecting the substrate to a solution of a metal salt or complex thereof so as to form a metal phosphorus compound, wherein said metal is selected from Groups I–B, II–B, IV–B, V–B, VI–B, VII–B, and VIII of the Periodic Table; applying a resist to a portion of the metal phosphorus compound coated substrate; removing the unprotected metal phosphorus compound from the substrate; dissolving the resist, and thereafter treating the substrate with a metal plating solution.

2. The process of claim 1 wherein the low oxidation state phosphorus compound is phosphorus sesquisulfide.

3. The process of claim 1 wherein the unprotected metal phosphorus compound is removed by an oxidizing medium.

4. The process of claim 3 wherein said oxidizing medium is an about 50 percent by volume solution of nitric acid.

5. The process of claim 4 wherein the metal is nickel and the substrate is a plastic.

6. The process wherein the substrate resulting from the process of claim 5 is electroplated.

7. A process for forming a design on a non-metallic substrate which comprises applying a resist to a portion of metal phosphorus compound provided at the surface of a substrate wherein said metal is selected from Groups I–B, II–B, IV–B, V–B, VI–B, VII–B and VIII of the Periodic Table; removing the unprotected metal phosphorus compound; dissolving the resist; and thereafter treating the substrate with a metal plating solution, wherein the metal phosphorus compound has been provided at the surface of the substrate by a process which comprises subjecting the substrate to a low oxidation state phosphorus compound, having an oxidation number of −3 to +3, and thereafter subjecting the thus treated substrate to a solution of a metal salt or complex thereof, wherein said metal is selected from Groups I–B, II–B, IV–B, V–B, VI–B, VII–B and VIII of the Periodic Table.

8. The process of claim 7 wherein the low oxidation state phosphorus compound is phosphorus sesquisulfide.

9. The process of claim 7 wherein the unprotected metal phosphorus compound is removed by an oxidizing medium.

10. The process of claim 9 wherein the oxidizing medium is an about 50 percent by volume solution of nitric acid.

11. The process wherein the treated substrate resulting from the process of claim 7 is electroplated.

12. The process of claim 11 wherein the metal is nickel and the substrate is a plastic.

13. A process for forming a design which comprises subjecting a substrate to a low oxidation state phosphorus compound having an oxidation number of −3 to +3; subjecting the thus treated substrate to a solution of a metal salt or complex thereof so as to form a metal phosphorus compound wherein said metal is selected from Groups I–B, II–B, IV–B, V–B, VI–B, VII–B and VIII of the Periodic Table; applying a resist to a portion of the metal phosphorus compound; depositing from a metal plating solution, metal on the exposed metal phosphorus compound; removing the resist; and removing the thus exposed metal phosphorus compound.

14. The process of claim 13 wherein the low oxidation state phosphorus compound is phosphorus sesquisulfide.

15. A process for forming a design which comprises applying a resist to a portion of a substrate; subjecting the substrate to a low oxidation state phosphorus compound having an oxidation number of −3 to +3; subjecting the substrate to a solution of a metal salt or complex thereof so as to form a metal phosphorus compound wherein said metal is selected from Groups I–B, II–B, IV–B, V–B, VI–B, VII–B and VIII of the Periodic Table; depositing, from a metal plating solution, metal on the metal phosphorus compound; and removing the resist.

16. An article produced by the process of claim 1.

17. An article produced by the process of claim 2.

18. An article produced by the process of claim 7.

19. An article produced by the process of claim 8.

20. An article produced by the process of claim 13.

21. An article produced by the process of claim 14.

22. An article produced by the process of claim 15.

References Cited

UNITED STATES PATENTS

| | | | |
|---|---|---|---|
| 3,625,730 | 12/1971 | Lee | 117—38 |
| 3,650,708 | 3/1972 | Gallagher | 117—71 |
| 3,650,914 | 3/1972 | Lin | 117—47 R |
| 3,650,803 | 3/1972 | Kingso | 204—30 |

JOHN H. MACK, Primary Examiner

T. TUFARIELLO, Assistant Examiner

U.S. Cl. X.R.

117—47 A, 212; 204—15, 30